United States Patent
Koning et al.

(10) Patent No.: US 7,180,174 B2
(45) Date of Patent: Feb. 20, 2007

(54) NANOTUBE MODIFIED SOLDER THERMAL INTERMEDIATE STRUCTURE, SYSTEMS, AND METHODS

(75) Inventors: Paul A. Koning, Chandler, AZ (US); Bryan M. White, Smyrna, GA (US)

(73) Assignee: Intel Corporation, Santa Clara, CA (US)

( * ) Notice: Subject to any disclaimer, the term of this patent is extended or adjusted under 35 U.S.C. 154(b) by 264 days.

(21) Appl. No.: 10/747,927

(22) Filed: Dec. 30, 2003

(65) Prior Publication Data

US 2005/0139642 A1 Jun. 30, 2005

(51) Int. Cl.
*H01L 23/10* (2006.01)
*H01L 23/34* (2006.01)
*H01L 23/52* (2006.01)
*H01L 29/40* (2006.01)
*H01L 23/48* (2006.01)

(52) U.S. Cl. .................. 257/706; 257/720; 257/778
(58) Field of Classification Search ........ 257/706–707, 257/720, 777–778, 796
See application file for complete search history.

(56) References Cited

U.S. PATENT DOCUMENTS

| 5,102,824 | A | 4/1992 | Neugebauer et al. | |
|---|---|---|---|---|
| 5,316,080 | A | 5/1994 | Banks et al. | 165/185 |
| 5,604,037 | A | 2/1997 | Ting et al. | 428/408 |
| 5,825,624 | A | 10/1998 | Arnold et al. | 361/708 |
| 5,837,081 | A | 11/1998 | Ting et al. | 156/89.26 |
| 5,965,267 | A | 10/1999 | Nolan et al. | 428/408 |
| 5,972,265 | A | 10/1999 | Marra et al. | |
| 6,312,303 | B1 | 11/2001 | Yaniv et al. | 445/24 |
| 6,407,922 | B1 | 6/2002 | Eckblad et al. | 361/704 |
| 6,630,772 | B1 | 10/2003 | Bower et al. | 313/311 |
| 6,891,724 | B2 | 5/2005 | De Lorenzo et al. | |
| 6,921,462 | B2 | 7/2005 | Montgomery et al. | |
| 2003/0077478 | A1* | 4/2003 | Dani et al. | 428/673 |
| 2003/0117770 | A1 | 6/2003 | Montgomery | 361/687 |

FOREIGN PATENT DOCUMENTS

| EP | 0538798 | 4/1993 |
|---|---|---|
| EP | 0689244 | 12/1995 |
| EP | 1054036 | 11/2000 |
| EP | 1109218 | 6/2001 |
| WO | WO-00/33628 | 6/2000 |
| WO | WO-01/30694 | 5/2001 |
| WO | WO-01/92381 | 12/2001 |

OTHER PUBLICATIONS

Bellar, R J., et al., "High Conduction Thermal Interface Material", *IBM Technical Disclosure Bulletin*, 36 (10), (Oct. 1, 1993), 581-583.
Andrews, R., "Nanotube Composite Carbon Fibers", *Applied Physics Letters*, 75, (Aug. 30, 1999), 1329-1331.

* cited by examiner

*Primary Examiner*—Cuong Nguyen
(74) *Attorney, Agent, or Firm*—Schwegman, Lundberg, Woessner & Kluth, P.A.

(57) ABSTRACT

An apparatus and system, as well as fabrication methods therefor, may include a thermal intermediate structure with metal decorated carbon nanotubes incorporated in solder.

17 Claims, 3 Drawing Sheets

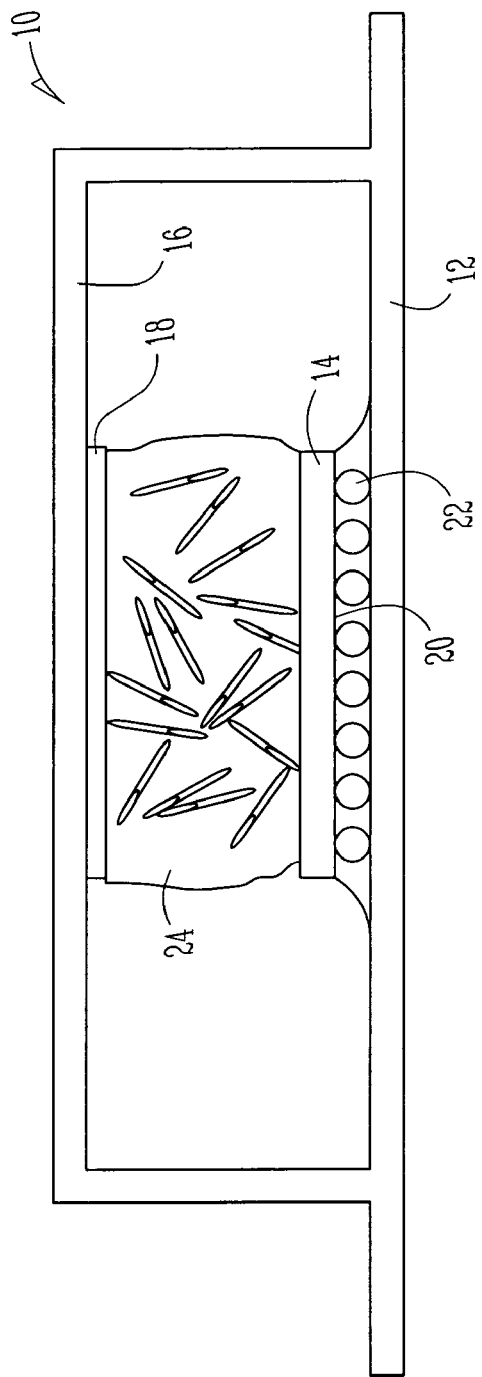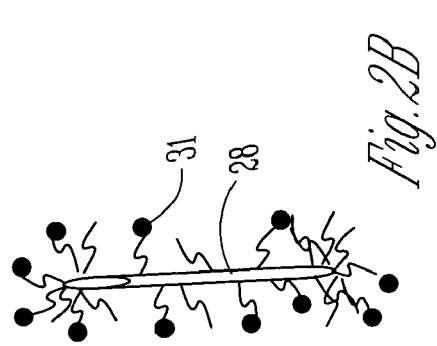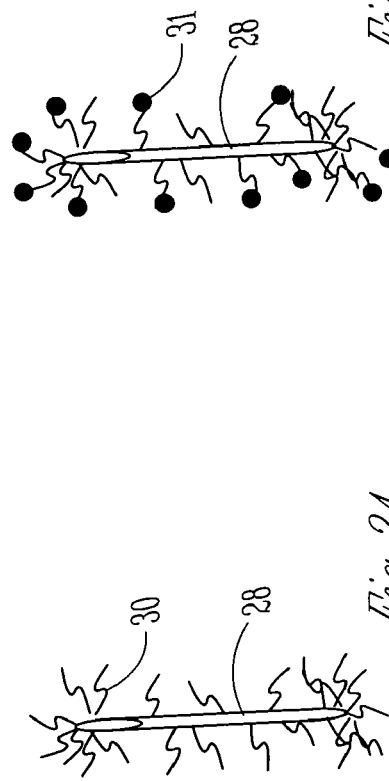
Fig. 1
Fig. 2A
Fig. 2B

NANOTUBE MODIFIED SOLDER THERMAL INTERMEDIATE STRUCTURE, SYSTEMS, AND METHODS

TECHNICAL FIELD

The subject matter relates generally to thermal intermediate structures, systems, and methods used to assist in transferring heat from one element or body, such as a circuit, to another, such as a heat sink.

BACKGROUND INFORMATION

Electronic components, such as integrated circuits, may be assembled into component packages by physically and electrically coupling them to a substrate. During operation, the package may generate heat which can be dissipated to help maintain the circuitry at a desired temperature. Heat sinks, including heat spreaders, may be coupled to the package using a suitable thermal intermediate structure to assist in transferring heat from the package to the heat sink.

BRIEF DESCRIPTION OF THE DRAWINGS

FIG. 1 illustrates an embodiment of a thermal intermediate structure placed between an electronic circuit die and a heat sink according to various embodiments;

FIGS. 2A and 2B are views in enlarged and schematic form of an embodiment of carbon nanotubes used in the thermal intermediate structure;

DETAILED DESCRIPTION

Figure 3:
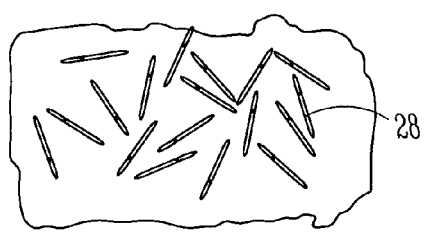
FIG. 3 is a view showing randomly aligned carbon nanotubes in solder.

In the following detailed description of various embodiments, reference is made to the accompanying drawings that form a part hereof, and in which are shown by way of illustration, and not of limitation, specific embodiments in which the subject matter may be practiced. In the drawings, like numerals describe substantially similar components throughout the several views. The embodiments illustrated are described in sufficient detail to enable those skilled in the art to practice the teachings disclosed herein. Other embodiments may be utilized and derived therefrom, such that compositional, structural, and logical substitutions and changes may be made without departing from the scope of this disclosure. The following detailed description, therefore, is not to be taken in a limiting sense.

Examples and embodiments merely typify possible variations. Individual components and functions are optional unless explicitly required, and the sequence of operations may vary. Portions and features of some embodiments may be included in or substituted for those of others. The following description is, therefore, not to be taken in a limiting sense.

FIG. 1 is a cross-section elevation view of an apparatus 10 according to various embodiments. Apparatus 10 includes a package substrate 12, a die 14 and a thermal management aid such as a heat sink or an integral heat spreader 16 which is mounted adjacent the die 14 and separated from it by a gap.

In an embodiment, the substrate of die 14 is made of silicon and has frontside and backside surfaces. The die 14 also has an integrated circuit 20 and solder bump contacts 22 on the frontside surface. The contacts 22 connect with contact pads (not shown) on the upper surface of package substrate 12. In some embodiments, the contacts 22 are manufactured according to a commonly used controlled collapse chip connect (C4) process.

In use, electric signals and power are provided to the integrated circuit 20. Operation of the integrated circuit 20 causes heating of die 14. Heat is transferred from the integrated circuit 20 through the substrate of die 14 to the heat spreader 16 through a thermal intermediate structure 24 interposed in the gap between them. In an embodiment a buffer layer 18 is interposed between thermal intermediate structure 24 and heat sink 16.

Carbon nanotubes have a coefficient of thermal conductivity along their longitudinal axis which is relatively high relative to their conductivity along a path oriented orthogonal to the longitudinal axis. The thermal conductivity of carbon nanotubes along their longitudinal axes is substantially higher than that of other materials used for thermal intermediates. The thermal conductivity of multi-walled nanotubes is about 3000 to 4000 W/m-K and theoretically about 6000 W/m-K for single walled nanotubes.

In an embodiment, the thermal intermediate structure 24 comprises a plurality of either multi-walled or single walled carbon nanotubes or a combination of both single and double walled nanotubes which are blended with solder. In an embodiment, the carbon nanotubes are chemically bonded to the solder. In an embodiment, the carbon nanotubes are distributed through a matrix of solder and make up a volume percentage the total less than about 5% to 50% of the volume of the composition by weight.

In an embodiment, the solder material is indium which has a thermal conductivity of at least about 85 W/mK. While in one embodiment a solder formed of an indium alloy could have a high thermal conductivity, other solder alloys generally have thermal conductivities of 30 W/mK or lower.

Forming a blend of carbon nanotubes and solder or a distribution of carbon nanotubes in a solder matrix is complicated due to the low wetting of nanotubes to most solders. In one embodiment, chemical bonding of the solder to carbon nanotubes of the plurality of carbon nanotubes is facilitated by pre-coating some of the carbon nanotubes prior to blending them with the molten solder.

In one embodiment, prior to the blending of the carbon nanotubes with the solder, at least some of the carbon nanotubes 28 of the thermal intermediate structure 24 are pre-coated or partially pre-coated with a metal is selected from the group consisting of gold, platinum, silver or palladium and alloys comprising one or more of gold, platinum, silver and palladium, or other suitable metals or alloys, by physical deposition or sputtering methods which are known.

In one embodiment, the coated nanotubes 28 are also referred to as decorated with the coating metal. The metal decorations on the nanotubes provide a wetting contact between the nanotubes and the solder to improve the bond between the solder and the nanotubes and further reduce the contact thermal resistance between nanotubes of the thermal intermediate structure 24 and either the surface of die 14 or of heat spreader 16.

In one embodiment, incorporation of metal particles 32 at various points distributed along the body of some nanotubes 28 of the plurality of nanotubes should improve the wetting of the nanotubes with solder surrounding those nanotubes. In one embodiment shown in FIG. 2A, a known process for decorating carbon nanotubes with gold, platinum, palladium or silver involves an initial refluxing of nanotubes with nitric acid to open closed tips of the tubes 28 and to create acid sites 30 on the surface of nanotubes 28 to act as nucleation centers for metal ions. Refluxing the nanotubes in the presence of a reducing agent such as $HAuCl_4$ results in FIG. 2B with gold particles 32 forming at the nucleation sites to produce decorated carbon nanotubes. Similarly, in an embodiment, a reducing agent $H_2PtCl_6$ is used to decorate the nanotubes with platinum. Similar processes can also be used to incorporate palladium or silver with acid opened nanotubes.

The acid sites 30 which receive the metal decorations 32 are understood to be generally dispersed over the body of the nanotubes 28 rather than along fault lines as would be expected in the case of metal decoration of graphite crystals, for example.

In one embodiment, electrochemical means of coating nanotubes with metal decorations can be utilized. In one embodiment, coating a second metal on the nanotube for alloying purposes as part of the metal decoration process can be utilized.

In one embodiment, other physical methods such as sputtering can be used to produce metal coated carbon nanotubes.

Decorating the carbon nanotubes 28 with metals 32 to improve the wetting of the nanotubes for forming a chemical bond between the solder 28 and the decorated nanotubes. In one embodiment, alignment of the nanotubes along the shortest heat transfer path will contribute to maximizing the thermal performance of the thermal intermediate structure 24. In FIG. 1, the shortest path for heat flow from die 14 to heat spreader 16 is along paths perpendicular to the surfaces of die 14 and heat spreader 16 which engage thermal intermediate structure 24.

In FIG. 3, a portion of a thermal intermediate structure 24 according to an embodiment is shown in enlarged schematic form with a plurality of carbon nanotubes 28 somewhat randomly oriented in the matrix of solder 29 into which they are mixed.

In one embodiment, some of the carbon nanotubes 28 of the plurality of carbon nanotubes are to be aligned in an x, y plane by successive rolling and folding operations performed on the solder 29 and carbon nanotube 28 composite material.

Figure 4:
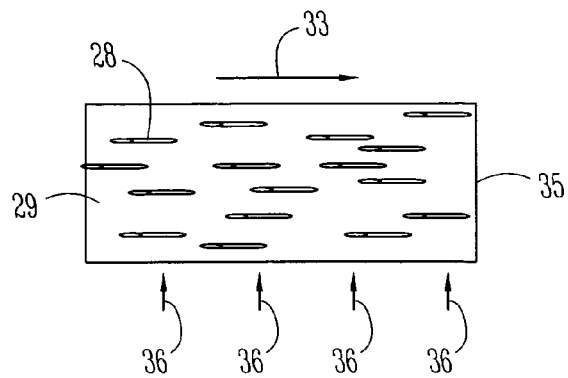
FIG. 4 illustrates a process for alignment of carbon nanotubes for use in the thermal intermediate structure.

In FIG. 4, a billet of indium solder which has incorporated within it a plurality of single walled nanotubes or of multiple walled nanotubes, is rolled or extruded along an axis 33 to align at least some nanotubes 28 of the plurality of nanotubes with each other and generally parallel to axis 33 as shown in FIG. 4 forming a billet 35 of solder material with blended nanotubes generally aligned with each other and parallel to axis 33.

Figure 5:
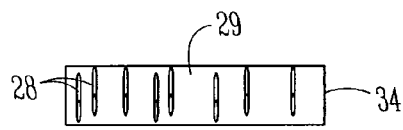
FIG. 5 is a view showing a thermal intermediate blank cut from the rolled billet of FIG. 4.

Indium is well adapted to such rolling and folding operations because it is soft and easily workable. The mixture of nanotubes 28 which are incorporated into the solder 29 do not materially detract from the mechanical workability of billet 35. In an embodiment, the density of nanotubes 28 in the solder 29 is less than about 5 to 30% by volume and is in some cases up to 50% by volume. In FIG. 5, a thermal intermediate blank 38 sliced from billet 35 of FIG. 4 along one of a series of transverse cutting lines formed at one of a series of longitudinal slicing points 36, is shown after being rotated by 90° from its alignment illustrated in FIG. 4. After a plurality of blanks 35 of solder/carbon nanotube composite are formed, the thin sections or blanks 35 are bonded together to achieve orientation of some of the plurality of carbon nanotubes in the z axis, normal to the heat sink 16 surface and the surface of die 14, for improved heat flow between the die and heat sink. One or more of such blanks 38 make up the thermal intermediate structure 24.

In one embodiment, extrusion or pultrusion of a rolled indium billet 35 is followed by slicing and rotating the slice to provide orientation of a high number of carbon nanotubes of the plurality of carbon nanotubes 28 in the z-axis.

Figure 6:
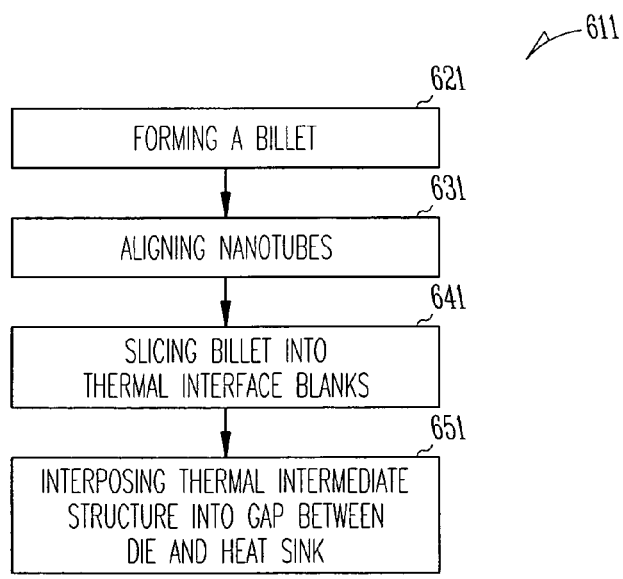
FIGS. 6–7 are flow charts illustrating methods according to various embodiments.

Some embodiments include a number of methods. For example, FIG. 6 is a flow chart illustrating several methods according to various embodiments. Thus, a method 611 may (optionally) begin at block 621 with forming a billet 35 of solder 29 incorporating a plurality of carbon nanotubes 28 therein which are chemically bonded to the solder. The method includes, at block 631, aligning a substantial percentage of the carbon nanotubes with an axis of the billet by successive rolling operations. In one embodiment in the method at block 631, the aligning a substantial number of the carbon nanotubes includes working the billet by a process selected from the group consisting of rolling extruding or pultruding to align some carbon nanotubes 28 of the plurality of carbon nanotubes with axis 33 (FIG. 4) along which the working of the billet 35 occurs.

In one embodiment, the method includes, in block 641, slicing the billet perpendicular to the axis 32 into thermal intermediate blanks 38 having a thickness substantially less than their length or width. The thermal intermediate blanks 38 are then assembled into a thermal intermediate structure 24 having a substantial percentage of the carbon nanotubes of plurality of carbon nanotubes 28 aligned.

In an embodiment, in block 651, the thermal intermediate structure 24 is interposed in a gap between a die 14 and a heat sink 16. In an embodiment, the gap between the die and the heat sink is less than or equal to about 20 microns. In other embodiments the gap may be as large as from about 150 to about 250 microns or as small as 5 microns.

Figure 7:
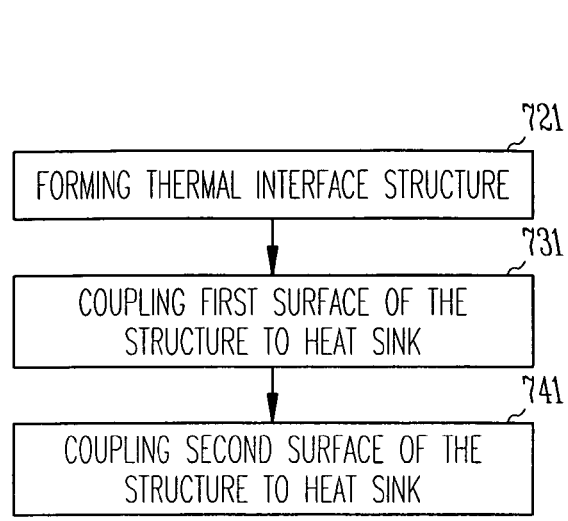

FIG. 7 is a flow chart of a method 710 illustrating several methods according to various embodiments. Thus, method 710 may (optionally) begin at block 721 with forming a thermal intermediate structure comprised of a plurality of metal decorated carbon nanotubes 28 blended into a solder material 29 with at least some of the plurality of carbon nanotubes 28 substantially aligned with an axis 32 of billet 35.

In an embodiment, the method includes, in block 731, coupling a first surface of the thermal intermediate structure to a surface of a heat sink with the surface of the thermal intermediate structure oriented substantially perpendicular to the surface of the heat sink. In one embodiment, the method includes, in block 741, coupling a second surface of the thermal intermediate structure to a surface of the heat source In an embodiment, the process in block 731 of coupling a first surface of the thermal intermediate structure 24 to a surface of a heat sink 16 also comprises forming a solder bond between the surface of the heat source 14 and the second surface of the thermal intermediate structure 24. In one embodiment, the process in block 741 of coupling a second surface of the thermal intermediate structure 24 to a surface of the heat sink 16 also comprises forming a solder bond between the surface of the heat sink 16 and the first surface of the thermal intermediate structure 24.

Figure 8:
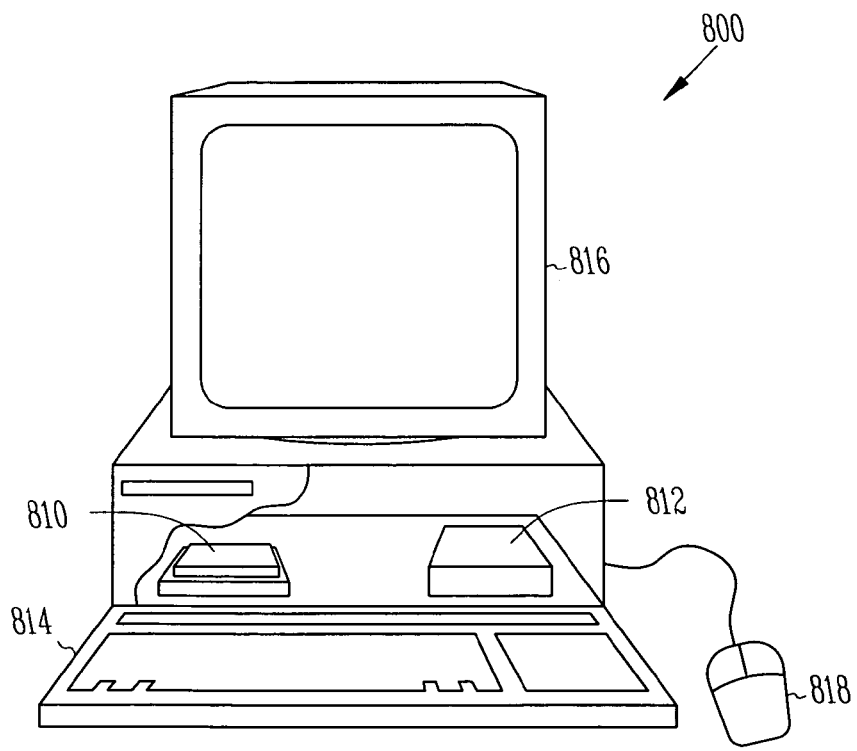
FIG. 8 is a depiction of a computing system according to an embodiment.

FIG. 8 is a depiction of a computing system according to an embodiment. One or more of the embodiments of apparatus with one or more dies 14 having a thermal intermediate structure 24 interposed between the die surface and the heat sink 16 and comprising a plurality of carbon nanotubes 28, some of which are decorated with metal 32, the plurality of carbon nanotubes blended with solder 29 may be used in a computing system such as a computing system 800 of FIG. 8. The computing system 800 includes at least one processor (not pictured), which is enclosed in a microelectronic device package 810, a data storage system 812, at least one input device such as a keyboard 814, and at least one output device such as a monitor 816, for example. The computing system 800 includes a processor that processes data signals, and may include, for example, a microprocessor available from Intel Corporation. In addition to the keyboard 814, an embodiment of the computing system includes a further user input device such as a mouse 818, for example.

For the purposes of this disclosure, a computing system 800 embodying components in accordance with the claimed subject matter may include any system that utilizes a microelectronic device package, which may include, for example, a data storage device such as dynamic random access memory, polymer memory, flash memory and phase change memory. The microelectronic device package can also include a die that contains a digital signal processor (DSP), a micro-controller, an application specific integrated circuit (ASIC), or a microprocessor.

Embodiments set forth in this disclosure can be applied to devices and apparatus other than a traditional computer. For example, a die 14 can be packaged with an embodiment of the thermal intermediate structure 24, and placed in a portable device such as a wireless communicator or a hand held device such as a personal data assistant or the like. Another example is a die 14 that can be coupled to a heat sink 16 with an embodiment of the thermal intermediate structure 24 and placed in a dirigible craft such as an automobile, a watercraft, an aircraft or a spacecraft.

The apparatus 10, substrate 12, die 14, heat spreader 16, integrated circuit 20, solder bumps 22 thermal intermediate structure 24 and metal decorated, aligned nanotubes 28 may all be characterized as "modules" herein. Such modules may include hardware circuitry, and/or a processor and/or memory circuits, software program modules and objects, and/or firmware, and combinations thereof, as desired by the architect of the apparatus 10 and system 900, and as appropriate for particular implementations of various embodiments. For example, such modules may be included in a system operations simulation package, such as a software electrical signal simulation package, a power usage and distribution simulation package, a thermo-mechanical stress simulation package, a power/heat dissipation simulation package, and/or a combination of software and hardware used to simulate the operation of various potential embodiments.

It should also be understood that the apparatus and systems of various embodiments can be used in applications other than for coupling and heat transfer between die and heat sinks and thus, these embodiments are not to be so limited. The illustrations of apparatus 10 and system 800 are intended to provide a general understanding of the elements and structure of various embodiments, and they are not intended to serve as a complete description of all the features of compositions, apparatus, and systems that might make use of the elements and structures described herein.

Applications that may include the novel apparatus and systems of various embodiments include electronic circuitry used in high-speed computers, communication and signal processing circuitry, data transceivers, modems, processor modules, embedded processors, and application-specific modules, including multilayer, multi-chip modules. Such apparatus and systems may further be included as sub-components within a variety of electronic systems, such as televisions, cellular telephones, personal computers, workstations, radios, video players, vehicles, and others.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

What is claimed is:

1. Apparatus, comprising:
   a die;
   a heat spreader; and
   a thermal intermediate material comprised of a plurality of carbon nanotubes blended with solder, the thermal intermediate material interposed in a gap between the die and the heat spreader, wherein some of the carbon nanotubes of the plurality of carbon nanotubes are chemically bonded to the solder.

2. The apparatus of claim 1, wherein the some of carbon nanotubes of the plurality of carbon nanotubes are pre-coated with a metal prior to blending with the solder.

3. The apparatus of claim 1, wherein some of the carbon nanotubes are decorated with metal.

4. The apparatus of claim 2, wherein the metal is platinum.

5. The apparatus of claim 2 wherein some of the carbon nanotubes are pre-coated with a metal to wet the solder to bond it to the carbon nanotubes.

6. The apparatus of claim 2, wherein the metal is selected from the group consisting of gold, platinum, silver and palladium and alloys comprising one or more of gold, platinum, silver and palladium.

7. The apparatus of claim 1, wherein some of the carbon nanotubes are aligned in the thermal intermediate material along the heat flow path between the die and the heat spreader.

8. The apparatus of claim 1 wherein the nanotubes are randomly oriented in the thermal intermediate material and have average lengths less than about 10 percent of the gap between the die and the heat spreader.

9. The apparatus of claim 1 wherein the solder is indium.

10. The apparatus of claim 1:
wherein the thermal intermediate material comprises a matrix, wherein the matrix exhibits a phase change between about 100° C. and about 230° C.; and
wherein the thermal intermediate material includes a distribution of the carbon nanotubes in the matrix having a length range from about 0.5 micron to about 10 micron, and wherein the interstitial carbon nanotube heat transfer structures occupy from less than about 5 to about 30 volume percent of the thermal intermediate material.

11. The apparatus of claim 10, wherein the matrix is a metal selected from the group consisting of indium or an indium alloy.

12. The apparatus of claim 11, wherein the carbon nanotubes are decorated with metal.

13. The apparatus of claim 12 wherein the metal is selected from the group consisting of platinum, gold, silver and palladium and their alloys.

14. A computing system, comprising:
at least one dynamic random access memory device;
a die including a die surface and a circuit to electrically couple to the memory device;
a heat sink; and
a thermal intermediate structure interposed between the die surface and the heat sink and comprising a plurality of carbon nanotubes, some of which are decorated with metal and blended with solder.

15. The system of claim 14, wherein the circuit comprises a processor that acts upon data signals, and may include, for example, a microprocessor.

16. The system of claim 14, wherein the metal is one or more metals selected from the group consisting of platinum, gold and silver and alloys of one or more of platinum gold and silver.

17. The system of claim 14 wherein the solder is indium.

* * * * *